United States Patent
Shimizu

(10) Patent No.: US 12,520,522 B2
(45) Date of Patent: Jan. 6, 2026

(54) SEMICONDUCTOR DEVICE, INVERTER CIRCUIT, DRIVING DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 599 days.

(21) Appl. No.: 17/823,088

(22) Filed: Aug. 30, 2022

(65) Prior Publication Data

US 2023/0307536 A1     Sep. 28, 2023

(30) Foreign Application Priority Data

Mar. 22, 2022 (JP) .................. 2022-045394

(51) Int. Cl.
| | |
|---|---|
| *H02P 27/06* | (2006.01) |
| *H10D 30/66* | (2025.01) |
| *H10D 62/13* | (2025.01) |
| *H10D 62/17* | (2025.01) |
| *H10D 62/832* | (2025.01) |

(52) U.S. Cl.
CPC .......... *H10D 30/668* (2025.01); *H02P 27/06* (2013.01); *H10D 62/157* (2025.01); *H10D 62/393* (2025.01); *H10D 62/8325* (2025.01)

(58) Field of Classification Search
CPC .... H02P 27/06; H10D 30/668; H10D 62/157; H10D 62/393; H10D 62/8325
See application file for complete search history.

(56) References Cited

U.S. PATENT DOCUMENTS

| | | | |
|---|---|---|---|
| 7,791,135 B2 | 9/2010 | Ueno | |
| 9,887,287 B1 | 2/2018 | Lichtenwalner et al. | |
| 2013/0214290 A1* | 8/2013 | Hayashi | H10D 62/111 257/77 |
| 2014/0145206 A1 | 5/2014 | Siemieniec et al. | |

(Continued)

FOREIGN PATENT DOCUMENTS

| | | |
|---|---|---|
| JP | 2008-186925 A | 8/2008 |
| JP | 2014-107571 A | 6/2014 |

(Continued)

*Primary Examiner* — Jeff W Natalini
*Assistant Examiner* — Ian Isaac Degrasse
(74) *Attorney, Agent, or Firm* — Oblon, McClelland, Maier & Neustadt, L.L.P.

(57) ABSTRACT

A semiconductor device according to an embodiment includes: a silicon carbide layer having a first surface and second surface parallel to a first direction and a second direction perpendicular to the first direction; a first trench and second trench extending in the first direction; an n-type first region in the silicon carbide layer; a p-type second region between the first region and the first surface in the silicon carbide layer; an n-type third region between the second region and the first surface in the silicon carbide layer; a p-type sixth region between the first region and the first trench in the silicon carbide layer; and a p-type eighth region located between the second region and the first trench, between the third region and the first trench, and in contact with the sixth region in the silicon carbide layer. The eighth regions are repeatedly disposed in the first direction.

15 Claims, 14 Drawing Sheets

(56) References Cited

U.S. PATENT DOCUMENTS

| | | | |
|---|---|---|---|
| 2016/0099316 A1* | 4/2016 | Arai | H01L 21/047 257/77 |
| 2017/0110573 A1* | 4/2017 | Laforet | H10D 30/0297 |
| 2018/0240906 A1 | 8/2018 | Tsujimura et al. | |
| 2018/0337275 A1 | 11/2018 | Shimizu et al. | |
| 2019/0140094 A1 | 5/2019 | Kurokawa et al. | |
| 2020/0020797 A1* | 1/2020 | Suzuki | H10D 62/107 |
| 2020/0035791 A1* | 1/2020 | Oshima | H10D 62/8325 |
| 2020/0220001 A1* | 7/2020 | Shimizu | H10D 64/693 |
| 2021/0184030 A1* | 6/2021 | Tanaka | H01L 21/0465 |
| 2021/0288156 A1 | 9/2021 | Fukui et al. | |
| 2022/0013640 A1 | 1/2022 | Tanaka et al. | |
| 2022/0310791 A1 | 9/2022 | Shimizu | |

FOREIGN PATENT DOCUMENTS

| | | |
|---|---|---|
| JP | 2018-46254 A | 3/2018 |
| JP | 2018-133528 A | 8/2018 |
| JP | 2018-195782 A | 12/2018 |
| JP | 2019-87611 A | 6/2019 |
| JP | 2019-195081 A | 11/2019 |
| JP | 2020-512682 A | 4/2020 |
| JP | 2020-77736 A | 5/2020 |
| JP | 2021-182639 A | 11/2021 |
| JP | 2022-15727 A | 1/2022 |
| JP | 2022-147463 A | 10/2022 |
| WO | WO 2021/106152 A1 | 6/2021 |

\* cited by examiner

FIG.3  B-B' CROSS SECTION

FIG.7 D-D' CROSS SECTION

FIG.9 E-E' CROSS SECTION

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2022-045394, filed on Mar. 22, 2022, the entire contents of which are incorporated herein by reference.

FIELD

Embodiments described herein relate generally to a semiconductor device, an inverter circuit, a driving device, a vehicle, and an elevator.

BACKGROUND

Silicon carbide (SiC) is expected as a material for next-generation semiconductor devices. As compared with silicon, silicon carbide is excellent in physical properties, for example, about three times the band gap, about ten times the breakdown field strength, and about three time the thermal conductivity. By utilizing these physical properties, a semiconductor device capable of performing low-loss operation and operating at a high temperature can be realized.

A metal oxide semiconductor field effect transistor (MOSFET) using silicon carbide is required to reduce on-resistance.

DETAILED DESCRIPTION

Figure 1:
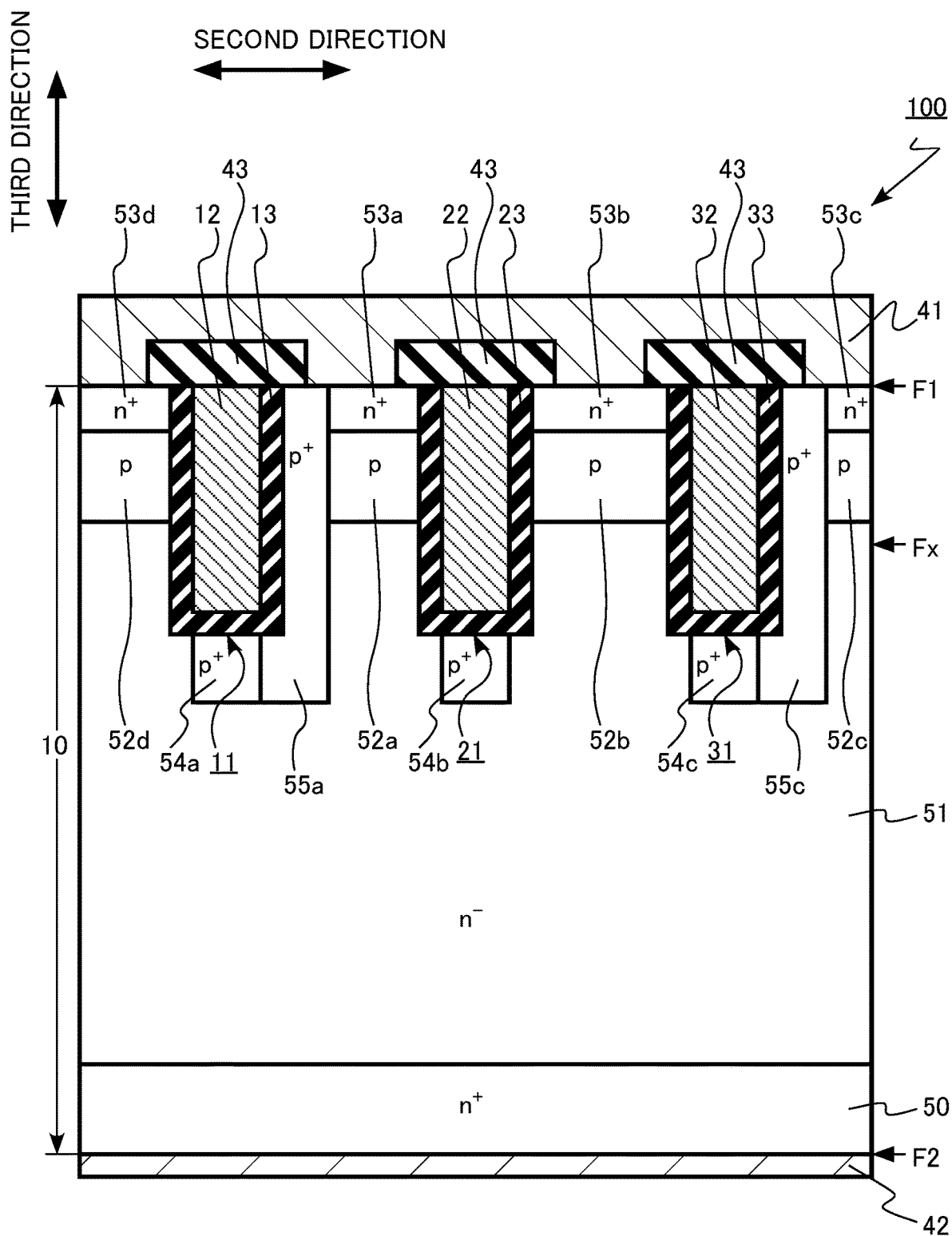
FIG. 1 is a schematic cross-sectional view of a semiconductor device according to a first embodiment.

A semiconductor device according to the embodiment includes: a silicon carbide layer having a first surface parallel to a first direction and a second direction perpendicular to the first direction, and a second surface parallel to the first surface; a first trench existing in the silicon carbide layer and extending in the first direction on the first surface; a first gate electrode located in the first trench; a first gate insulating layer located between the first gate electrode and the silicon carbide layer; a second trench existing in the silicon carbide layer and extending in the first direction on the first surface; a second gate electrode located in the second trench; a second gate insulating layer located between the second gate electrode and the silicon carbide layer; a third trench existing in the silicon carbide layer, extending in the first direction on the first surface, and the second trench located between the third trench and the first trench; a third gate electrode located in the third trench; a third gate insulating layer located between the third gate electrode and the silicon carbide layer; an n-type first silicon carbide region located in the silicon carbide layer; a p-type second silicon carbide region located in the silicon carbide layer, between the first silicon carbide region and the first surface, and between the first trench and the second trench; a p-type third silicon carbide region located in the silicon carbide layer, between the first silicon carbide region and the first surface, and between the second trench and the third trench; an n-type fourth silicon carbide region located in the silicon carbide layer and between the second silicon carbide region and the first surface; an n-type fifth silicon carbide region located in the silicon carbide layer and between the third silicon carbide region and the first surface; a p-type sixth silicon carbide region located in the silicon carbide layer and between the first silicon carbide region and the first trench; a p-type seventh silicon carbide region located in the silicon carbide layer and between the first silicon carbide region and the second trench; a plurality of p-type eighth silicon carbide regions located in the silicon carbide layer, in contact with the sixth silicon carbide region, and located between the first silicon carbide region and the first trench, between the second silicon carbide region and the first trench, and between the fourth silicon carbide region and the first trench, the p-type eighth silicon carbide regions being repeatedly disposed in the first direction; a plurality of p-type ninth silicon carbide regions located in the silicon carbide layer, in contact with the seventh silicon carbide region, and located between the first silicon carbide region and the second trench, between the third silicon carbide region and the second trench, and between the fifth silicon carbide region and the second trench, the p-type ninth silicon carbide regions being repeatedly disposed in the first direction; a first electrode located on the first surface side with respect to the silicon carbide layer and in contact with the fourth silicon carbide region, the fifth silicon carbide region, the eighth silicon carbide region, and the ninth silicon carbide region; and a second electrode located on the second surface side with respect to the silicon carbide layer.

Hereinafter, embodiments of the present disclosure will be described with reference to the drawings. In the following description, the same or similar members are denoted by the same reference numerals, and the description of the members described once is appropriately omitted.

In the following description, in a case where notations of $n^{++}$, $n^+$, n, and $n^-$, and notations of $p^{++}$, $p^+$, p, and $p^-$ are used, these notations represent the relative level of impurity concentration in each conductivity type. That is, it is indicated that $n^+$ has n-type impurity concentration relatively higher than that of $n^+$, $n^+$ has the n-type impurity concentration relatively higher than that of n, and $n^-$ has the n-type impurity concentration relatively lower than that of n. It is indicated that p$^{++}$ has p-type impurity concentration relatively higher than that of p$^+$, p$^+$ has the p-type impurity concentration relatively higher than that of p, and p$^-$ has the p-type impurity concentration relatively lower than that of p. n$^{++}$-type, n$^+$-type, and n$^-$-type may be simply referred to as n-type, and p$^{++}$-type, p$^+$-type, and p$^-$-type may be simply referred to as p-type.

The impurity concentration can be measured by, for example, secondary ion mass spectrometry (SIMS). The relative level of the impurity concentration can also be determined based on the level of carrier concentration obtained by, for example, scanning capacitance microscopy (SCM). A distance such as the width and depth of an impurity region can be obtained by, for example, the SIMS. The distance such as the width and depth of the impurity region can be obtained from, for example, an SCM image.

The width of a trench, the interval between the trenches, the depth of the trench, the thickness of an insulating layer, and the like can be measured, for example, on an image of the SIMS or a transmission electron microscope (TEM).

First Embodiment

A semiconductor device according to the first embodiment includes: a silicon carbide layer having a first surface parallel to a first direction and a second direction perpendicular to the first direction, and a second surface parallel to the first surface; a first trench existing in the silicon carbide layer and extending in the first direction on the first surface; a first gate electrode located in the first trench; a first gate insulating layer located between the first gate electrode and the silicon carbide layer; a second trench existing in the silicon carbide layer and extending in the first direction on the first surface; a second gate electrode located in the second trench; a second gate insulating layer located between the second gate electrode and the silicon carbide layer; a third trench existing in the silicon carbide layer, extending in the first direction on the first surface, and the second trench located between the third trench and the first trench; a third gate electrode located in the third trench; a third gate insulating layer located between the third gate electrode and the silicon carbide layer; an n-type first silicon carbide region located in the silicon carbide layer; a p-type second silicon carbide region located in the silicon carbide layer, between the first silicon carbide region and the first surface, and between the first trench and the second trench; a p-type third silicon carbide region located in the silicon carbide layer, between the first silicon carbide region and the first surface, and between the second trench and the third trench; an n-type fourth silicon carbide region located in the silicon carbide layer and between the second silicon carbide region and the first surface; an n-type fifth silicon carbide region located in the silicon carbide layer and between the third silicon carbide region and the first surface; a p-type sixth silicon carbide region located in the silicon carbide layer and between the first silicon carbide region and the first trench; a p-type seventh silicon carbide region located in the silicon carbide layer and between the first silicon carbide region and the second trench; a plurality of p-type eighth silicon carbide regions located in the silicon carbide layer, in contact with the sixth silicon carbide region, and located between the first silicon carbide region and the first trench, between the second silicon carbide region and the first trench, and between the fourth silicon carbide region and the first trench, the p-type eighth silicon carbide regions being repeatedly disposed in the first direction; a plurality of p-type ninth silicon carbide regions located in the silicon carbide layer, in contact with the seventh silicon carbide region, and located between the first silicon carbide region and the second trench, between the third silicon carbide region and the second trench, and between the fifth silicon carbide region and the second trench, the p-type ninth silicon carbide regions being repeatedly disposed in the first direction; a first electrode located on the first surface side with respect to the silicon carbide layer and in contact with the fourth silicon carbide region, the fifth silicon carbide region, the eighth silicon carbide region, and the ninth silicon carbide region; and a second electrode located on the second surface side with respect to the silicon carbide layer. In a first cross section perpendicular to the first surface, perpendicular to the first direction, and including one of the eighth silicon carbide regions, the ninth silicon carbide region does not exist, and in a second cross section parallel to the first cross section and including one of the ninth silicon carbide regions, the eighth silicon carbide region does not exist.

FIG. 1 is a schematic cross-sectional view of the semiconductor device according to the first embodiment. The semiconductor device of the first embodiment is a trench gate type vertical MOSFET 100 using silicon carbide. The MOSFET 100 is an n-channel type MOSFET using electrons as carriers.

Figure 2:
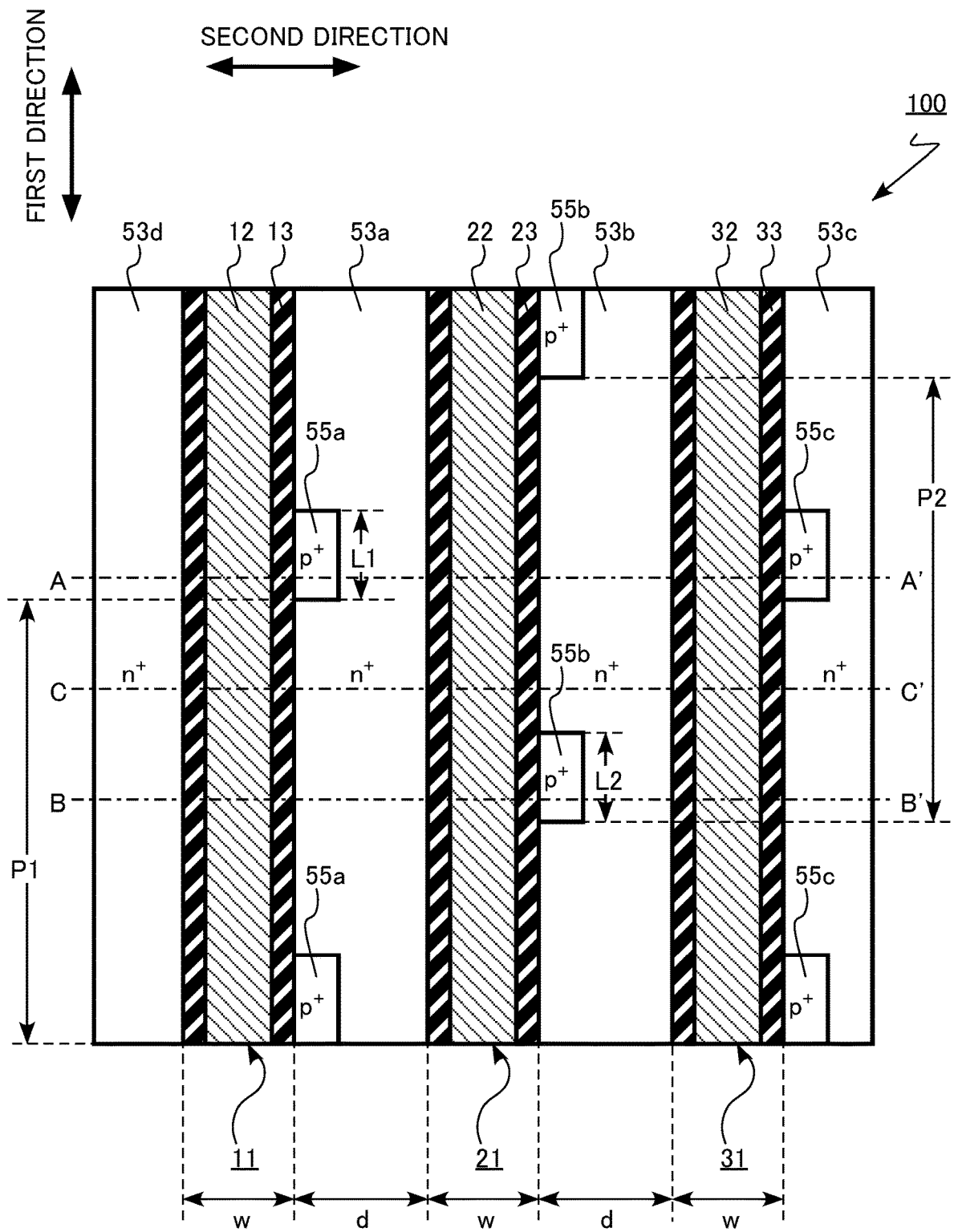
FIG. 2 is a schematic plan view of the semiconductor device according to the first embodiment.

FIG. 2 is a schematic plan view of the semiconductor device according to the first embodiment. FIG. 2 is a plan view of a first surface (F1 in FIG. 1) of FIG. 1. The first direction and the second direction are directions parallel to the first surface F1. The second direction is a direction perpendicular to the first direction. FIG. 1 is a cross-sectional view taken along line A-A' of FIG. 2. A-A' cross section is an example of the first cross section.

Figure 3:
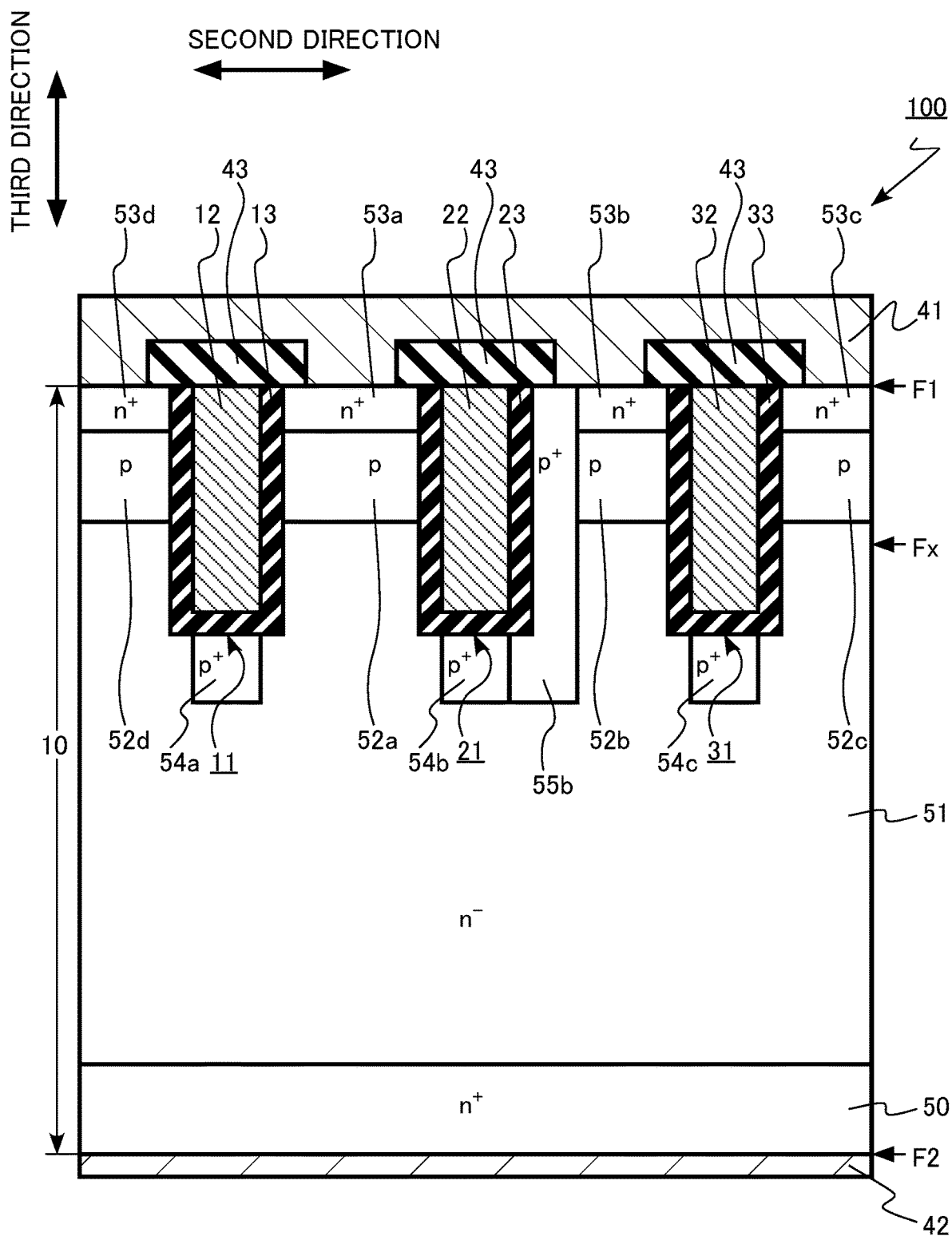
FIG. 3 is a schematic cross-sectional view of the semiconductor device according to the first embodiment.

FIG. 3 is a schematic cross-sectional view of the semiconductor device according to the first embodiment. FIG. 3 is a cross-sectional view taken along line B-B' of FIG. 2. B-B' cross section is an example of the second cross section.

Figure 4:
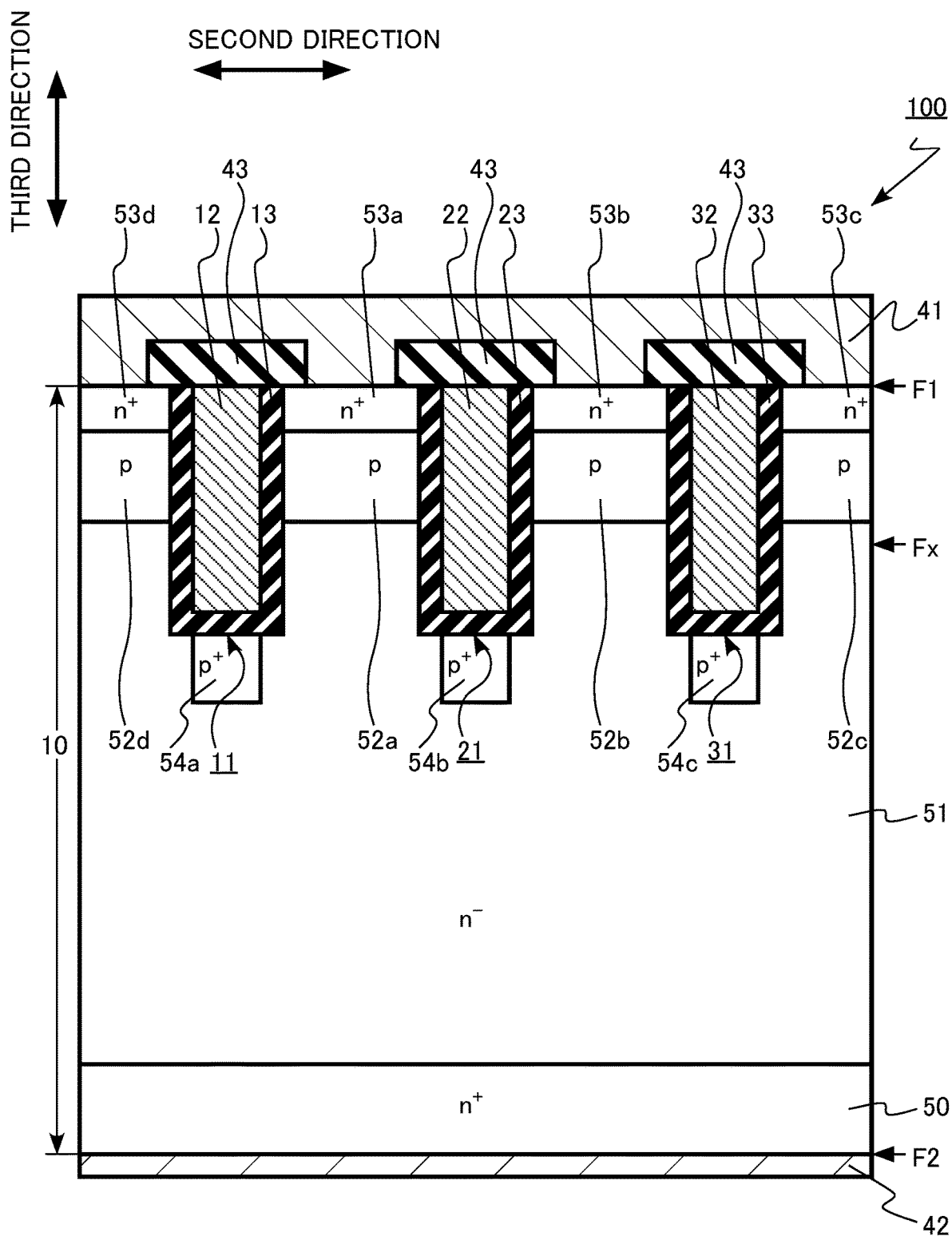
FIG. 4 is a schematic cross-sectional view of the semiconductor device according to the first embodiment.

FIG. 4 is a schematic cross-sectional view of the semiconductor device according to the first embodiment. FIG. 4 is a cross-sectional view taken along line C-C' of FIG. 2.

The MOSFET 100 includes a silicon carbide layer 10, a first trench 11, a first gate electrode 12, a first gate insulating layer 13, a second trench 21, a second gate electrode 22, a second gate insulating layer 23, a third trench 31, a third gate electrode 32, a third gate insulating layer 33, a source electrode 41 (first electrode), a drain electrode 42 (second electrode), and an interlayer insulating layer 43.

Hereinafter, the first trench 11, the second trench 21, and the third trench 31 may be collectively referred to as a trench. The first gate electrode 12, the second gate electrode 22, and the third gate electrode 32 may be collectively referred to as a gate electrode. The first gate insulating layer 13, the second gate insulating layer 23, and the third gate insulating layer 33 may be collectively referred to as a gate insulating layer.

In the silicon carbide layer 10, an n$^+$-type drain region 50, an n$^-$-type drift region 51 (first silicon carbide region), a p-type first body region 52$a$ (second silicon carbide region), a p-type second body region 52$b$ (third silicon carbide region), a p-type third body region 52$c$, a p-type fourth body region 52$d$, an n$^+$-type first source region 53$a$ (fourth silicon carbide region), an n$^+$-type second source region 53$b$ (fifth silicon carbide region), an n$^+$-type third source region 53$c$, an n$^+$-type fourth source region 53$d$, a p$^+$-type first electric field relaxation region 54$a$ (sixth silicon carbide region), a p$^+$-type second electric field relaxation region 54$b$ (seventh silicon carbide region), a p$^+$-type third electric field relaxation region 54$c$, a p$^+$-type first connection region 55$a$ (eighth silicon carbide region), a p$^+$-type second connection region 55b (ninth silicon carbide region), and a p$^+$-type third connection region 55c are provided.

Hereinafter, the first body region 52a, the second body region 52b, the p-type third body region 52c, and the fourth body region 52d may be collectively referred to as a body region 52. The first source region 53a, the second source region 53b, the third source region 53c, and the fourth source region 53d may be collectively referred to as a source region 53. The first electric field relaxation region 54a, the second electric field relaxation region 54b, and the third electric field relaxation region 54c may be collectively referred to as an electric field relaxation region 54. The first connection region 55a, the second connection region 55b, and the third connection region 55c may be collectively referred to as a connection region 55.

The silicon carbide layer 10 is formed of single-crystal SiC. The silicon carbide layer 10 is formed of, for example, 4H-SiC.

The silicon carbide layer 10 includes a first surface ("F1" in FIG. 1) and a second surface ("F2" in FIG. 1). The first surface F1 and the second surface F2 are opposed to each other. Hereinafter, the first surface F1 is also referred to as a front surface, and the second surface F2 is also referred to as a back surface. Hereinafter, a "depth" means a depth in a direction toward the second surface F2 with respect to the first surface F1.

In FIGS. 1 to 4, the first direction and the second direction are parallel to the first surface F1 and the second surface F2. A third direction is perpendicular to the first surface F1 and the second surface F2.

Figure 5:
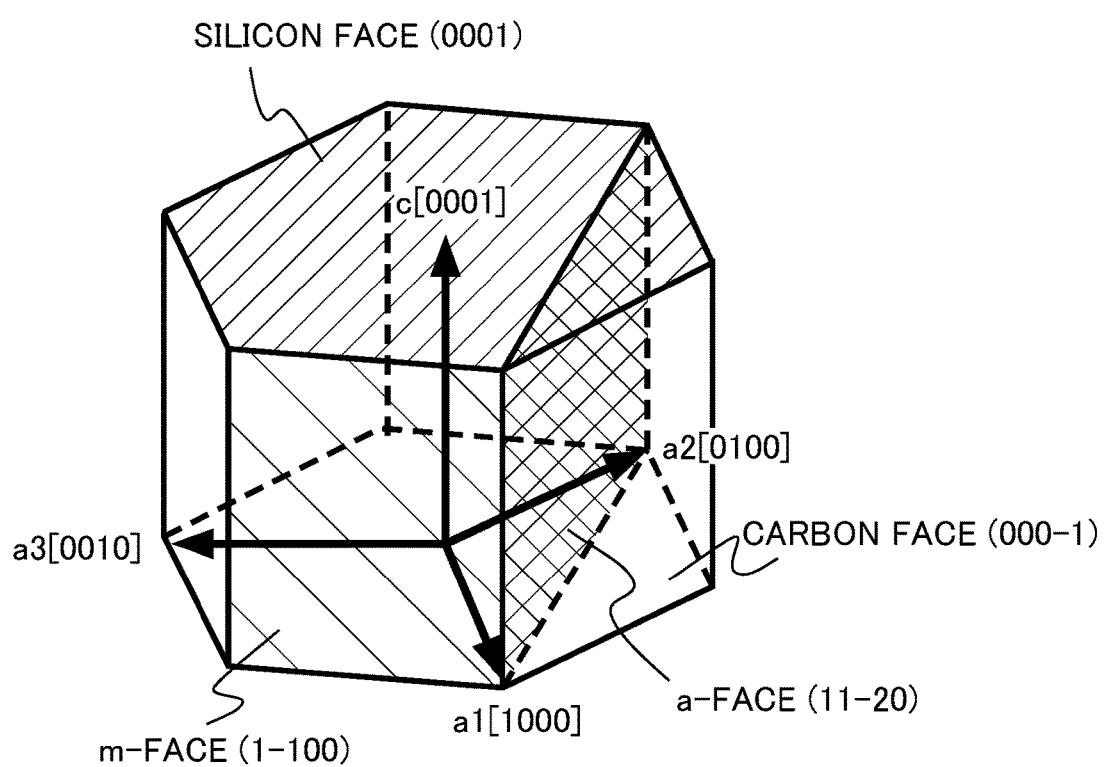
FIG. 5 is a view illustrating a crystal structure of a silicon carbide semiconductor.

FIG. 5 is a view illustrating a crystal structure of a silicon carbide semiconductor. A typical crystal structure of the silicon carbide semiconductor is a hexagonal crystal system such as 4H-SiC. One face having a c-axis as a normal line along the axial direction of a hexagonal prism (top face of the hexagonal prism) is a (0001) face. A face equivalent to the (0001) face is referred to as a silicon face and denoted as a {0001} face. Silicon (Si) is arranged on the silicon face.

The other face having the c-axis as the normal line along the axial direction of the hexagonal prism (top face of the hexagonal prism) is a (000-1) face. A face equivalent to the (000-1) face is referred to as a carbon face and denoted as a {000-1} face. Carbon (C) is arranged on the carbon face.

On the other hand, a side surface (columnar face) of the hexagonal prism is an m-face which is a surface equivalent to a (1-100) face, that is, a {1-100} face. A face passing through a pair of ridgelines not adjacent to each other is an a-face which is a surface equivalent to a (11-20) face, that is, a {11-20} face. Both silicon (Si) and carbon (C) are arranged on the m-face and the a-face.

The first surface F1 is, for example, a surface inclined at equal to or greater than zero degrees and equal to or less than eight degrees with respect to the (0001) face. That is, the first surface F1 is a surface of which the normal line is inclined at equal to or greater than zero degrees and equal to or less than eight degrees with respect to the c-axis in a [0001] direction. In other words, an off angle with respect to the (0001) face is equal to or greater than zero degrees and equal to or less than eight degrees. The second surface F2 is, for example, a surface inclined at equal to or greater than zero degrees and equal to or less than eight degrees with respect to the (000-1) face.

The (0001) face is referred to as a silicon face. The (000-1) face is referred to as a carbon face.

The inclination direction of each of the first surface F1 and the second surface F2 is, for example, a <11-20> direction. The <11-20> direction is an a-axis direction. In FIG. 1, for example, the first direction illustrated in FIG. 2 is in the same plane as the a-axis direction.

The first trench 11, the second trench 21, and the third trench 31 exist in the silicon carbide layer 10. The first trench 11, the second trench 21, and the third trench 31 are recesses provided in the silicon carbide layer 10. As illustrated in the FIG. 2, the first trench 11, the second trench 21, and the third trench 31 extend in the first direction.

Widths (w in FIG. 2) of the first trench 11, the second trench 21, and the third trench 31 in the second direction are, for example, smaller than a distance (d in FIG. 2) between the first trench 11 and the second trench 21 and a distance (d in FIG. 2) between the second trench 21 and the third trench 31.

The widths (w in FIG. 2) of the first trench 11, the second trench 21, and the third trench 31 in the second direction are, for example, equal to or greater than 0.2 μm and equal to or less than 1 μm. The widths of the first trench 11, the second trench 21, and the third trench 31 are more preferably equal to or greater than 0.3 μm and equal to or less than 0.5 μm. The distance (d in FIG. 2) between the first trench 11 and the second trench 21 and the distance (d in FIG. 2) between the second trench 21 and the third trench 31 are, for example, equal to or greater than 0.3 μm and equal to or less than 2 μm. The distance (d in FIG. 2) between the first trench 11 and the second trench 21 and the distance (d in FIG. 2) between the second trench 21 and the third trench 31 are more preferably equal to or greater than 0.5 μm and equal to or less than 1 μm. The depths of the first trench 11, the second trench 21, and the third trench 31 are, for example, equal to or greater than 0.5 μm and equal to or less than 2 μm. The depths of the first trench 11, the second trench 21, and the third trench 31 are more preferably equal to or greater than 0.7 μm and equal to or less than 1.5 μm.

A plurality of trenches including the first trench 11, the second trench 21, and the third trench 31 are repeatedly disposed in the second direction. The repetition pitch of the trenches in the second direction is, for example, equal to or greater than 1 μm and equal to or less than 6 μm. The repetition pitch of the trenches in the second direction is more preferably equal to or greater than 1.6 μm and equal to or less than 3 μm.

The second trench 21 is located between the first trench 11 and the third trench 31.

The inclination angle of the side surface of the first trench 11 with respect to the m-face or the a-face is, for example, equal to or greater than zero degrees and equal to or less than five degrees.

The first gate electrode 12 is provided in the first trench 11. The first gate electrode 12 is provided between the source electrode 41 and the drain electrode 42. The first gate electrode 12 extends in the first direction.

The first gate insulating layer 13 is provided between the first gate electrode 12 and the silicon carbide layer 10. The first gate insulating layer 13 is provided between the first source region 53a, fourth source region 53d, first body region 52a, fourth body region 52d, first electric field relaxation region 54a, and first connection region 55a, and the first gate electrode 12.

The inclination angle of the side surface of the second trench 21 with respect to the m-face or the a-face is, for example, equal to or greater than zero degrees and equal to or less than five degrees.

The second gate electrode 22 is provided in the second trench 21. The second gate electrode 22 is provided between the source electrode 41 and the drain electrode 42. The second gate electrode 22 extends in the first direction.

The second gate insulating layer 23 is provided between the second gate electrode 22 and the silicon carbide layer 10. The second gate insulating layer 23 is provided between the first source region 53a, second source region 53b, first body region 52a, second body region 52b, second electric field relaxation region 54b, and second connection region 55b, and the second gate electrode 22.

The inclination angle of the side surface of the third trench 31 with respect to the mi-face or the a-face is, for example, equal to or greater than zero degrees and equal to or less than five degrees.

The third gate electrode 32 is provided in the third trench 31. The third gate electrode 32 is provided between the source electrode 41 and the drain electrode 42. The third gate electrode 32 extends in the first direction.

The third gate insulating layer 33 is provided between the third gate electrode 32 and the silicon carbide layer 10. The third gate insulating layer 33 is provided between the second source region 53b, third source region 53c, second body region 52b, third body region 52c, third electric field relaxation region 54c, and third connection region 55c, and the third gate electrode 32.

The first gate electrode 12, the second gate electrode 22, and the third gate electrode 32 are conductive layers. The first gate electrode 12, the second gate electrode 22, and the third gate electrode 32 are, for example, formed of polycrystalline silicon containing a p-type impurity or an n-type impurity.

The first gate insulating layer 13, the second gate insulating layer 23, and the third gate insulating layer 33 are, for example, silicon oxide films. For example, a high-k insulating film (high dielectric constant insulating film such as HfSiON, ZrSiON, or AlON) can be applied to the first gate insulating layer 13, the second gate insulating layer 23, and the third gate insulating layer 33. For example, a stacked film formed by stacking the silicon oxide film ($SiO_2$) and the high-K insulating film can also be applied to the first gate insulating layer 13, the second gate insulating layer 23, and the third gate insulating layer 33.

The interlayer insulating layer 43 is provided on each of the first gate electrode 12, the second gate electrode 22, and the third gate electrode 32. The interlayer insulating layer 43 is, for example, a silicon oxide film.

The source electrode 41 is provided on the surface side with respect to the silicon carbide layer 10. The source electrode 41 is provided on the surface of the silicon carbide layer 10.

The source electrode 41 is electrically connected to the first source region 53a, the second source region 53b, the third source region 53c, and the fourth source region 53d. The source electrode 41 is in contact with the first source region 53a, the second source region 53b, the third source region 53c, and the fourth source region 53d.

The source electrode 41 is electrically connected to the first connection region 55a, the second connection region 55b, and the third connection region 55c. The source electrode 41 is in contact with the first connection region 55a, the second connection region 55b, and the third connection region 55c.

The source electrode 41 contains metal. The metal forming the source electrode 41 has, for example, a stacked structure obtained by stacking titanium (Ti) and aluminum (Al). The source electrode 41 may contain metal silicide or metal carbide in contact with the silicon carbide layer 10.

The drain electrode 42 is provided on the back surface side with respect to the silicon carbide layer 10. The drain electrode 42 is provided on the back surface of the silicon carbide layer 10. The drain electrode 42 is in contact with the drain region 50.

The drain electrode 42 is formed of, for example, metal or a metal semiconductor compound. The drain electrode 42 contains, for example, a material selected from the group consisting of nickel silicide (NiSi), titanium (Ti), nickel (Ni), silver (Ag), and gold (Au).

The $n^+$-type drain region 50 is provided on the back surface side of the silicon carbide layer 10. The drain region 50 contains, for example, nitrogen (N) as an n-type impurity. The n-type impurity concentration of the drain region 50 is, for example, equal to or greater than $1 \times 10^{18}$ cm$^{-3}$ and equal to or less than $1 \times 10^{21}$ cm$^{-3}$.

The $n^-$-type drift region 51 is provided on the drain region 50. The drift region 51 is provided between the drain region 50 and the surface of the silicon carbide layer 10.

The drift region 51 contains, for example, nitrogen (N) as an n-type impurity. The n-type impurity concentration of the drift region 51 is, for example, equal to or greater than $4 \times 10^{14}$ cm$^{-3}$ and equal to or less than $1 \times 10^{18}$ cm$^{-3}$. The thickness of the drift region 51 in the third direction is, for example, equal to or greater than 5 μm and equal to or less than 150 μm.

The p-type first body region 52a is provided between the drift region 51 and the surface of the silicon carbide layer 10. The first body region 52a is provided between the first trench 11 and the second trench 21. The first body region 52a is in contact with the first trench 11 and the second trench 21. The first body region 52a is in contact with the first gate insulating layer 13 and the second gate insulating layer 23.

The p-type second body region 52b is provided between the drift region 51 and the surface of the silicon carbide layer 10. The second body region 52b is provided between the second trench 21 and the third trench 31. The second body region 52b is in contact with the second trench 21 and the third trench 31. The second body region 52b is in contact with the second gate insulating layer 23 and the third gate insulating layer 33.

The body region 52 functions as a channel region of the MOSFET 100. For example, when the MOSFET 100 is turned on, a channel through which electrons flow is formed in a region of the body region 52 in contact with the gate insulating layer.

The body region 52 contains, for example, aluminum (Al) as a p-type impurity. The p-type impurity concentration of the body region 52 is, for example, equal to or greater than $5 \times 10^{16}$ cm$^{-3}$ and equal to or less than $5 \times 10^{17}$ cm$^{-3}$. The depth of the body region 52 is, for example, equal to or greater than 0.2 μm and equal to or less than 1.0 μm.

The $n^+$-type first source region 53a is provided between the first body region 52a and the surface of the silicon carbide layer 10. The first source region 53a is in contact with the source electrode 41. The first source region 53a is in contact with the first trench 11 and the second trench 21. The first source region 53a is in contact with the first gate insulating layer 13 and the second gate insulating layer 23.

The $n^+$-type second source region 53b is provided between the second body region 52b and the surface of the silicon carbide layer 10. The second source region 53b is in contact with the source electrode 41. The second source region 53b is in contact with the second trench 21 and the third trench 31. The second source region 53b is in contact with the second gate insulating layer 23 and the third gate insulating layer 33.

The n-type impurity concentration of the source region 53 is, for example, equal to or greater than $1\times10^{19}$ cm$^{-3}$ and equal to or less than $1\times10^{21}$ cm$^{-3}$. The depth of the source region 53 is smaller than the depth of the body region 52, for example, equal to or greater than 0.1 μm and equal to or less than 0.3 μm. The distance between the drift region 51 and the source region 53 is, for example, equal to or greater than 0.1 μm and equal to or less than 0.9 μm.

The p$^+$-type first electric field relaxation region 54a is provided between the drift region 51 and the first trench 11. The first electric field relaxation region 54a is provided between the drift region 51 and the bottom surface of the first trench 11. The first electric field relaxation region 54a is in contact with the bottom surface of the first trench 11.

The p$^+$-type second electric field relaxation region 54b is provided between the drift region 51 and the second trench 21. The second electric field relaxation region 54b is provided between the drift region 51 and the bottom surface of the second trench 21. The second electric field relaxation region 54b is in contact with the bottom surface of the second trench 21.

The p$^+$-type third electric field relaxation region 54c is provided between the drift region 51 and the third trench 31. The third electric field relaxation region 54c is provided between the drift region 51 and the bottom surface of the third trench 31. The third electric field relaxation region 54c is in contact with the bottom surface of the third trench 31.

The electric field relaxation region 54 contains, for example, aluminum (Al) as a p-type impurity. The p-type impurity concentration of the electric field relaxation region 54 is, for example, higher than the p-type impurity concentration of the body region 52. The p-type impurity concentration of the electric field relaxation region 54 is, for example, equal to or greater than $1\times10^{17}$ cm$^{-3}$ and equal to or less than $1\times10^{20}$ cm$^{-3}$.

The electric field relaxation region 54 can be formed, for example, by forming a trench in the silicon carbide layer 10 and then performing ion implantation of aluminum (Al) into the silicon carbide layer 10 from the bottom surface of the trench.

An electric potential of the electric field relaxation region 54 is fixed at the electric potential of the source electrode 41. The electric potential of the electric field relaxation region 54 is fixed at a source electric potential. The electric field relaxation region 54 has a function of relaxing an electric field applied to the gate insulating layer at the bottom portion of the trench.

The p$^+$-type first connection region 55a is in contact with the first electric field relaxation region 54a. The first connection region 55a is provided between the drift region 51 and the first trench 11. The first connection region 55a is provided between the first body region 52a and the first trench 11. The first connection region 55a is provided between the first source region 53a and the first trench 11.

The first connection region 55a is in contact with the side surface of the first trench 11. The first connection region 55a is, for example, in contact with the bottom surface of the first trench 11. The first connection region 55a is, for example, in contact with the first surface F1.

The first connection region 55a between the first source region 53a and the first trench 11 is in contact with the first trench 11. The first connection region 55a between the first source region 53a and the first trench 11 is in contact with first gate insulating layer 13.

The first connection region 55a is in contact with the source electrode 41 on the first surface F1.

A plurality of the first connection regions 55a are repeatedly disposed in the first direction. The first connection regions 55a are repeatedly disposed at a first pitch (P1 in FIG. 2) in the first direction.

The length (L1 in FIG. 2) of the first connection region 55a in the first direction is, for example, equal to or greater than 0.5 μm and equal to or less than 3 μm.

The p$^+$-type second connection region 55b is in contact with the second electric field relaxation region 54b. The second connection region 55b is provided between the drift region 51 and the second trench 21. The second connection region 55b is provided between the second body region 52b and the second trench 21. The second connection region 55b is provided between the second source region 53b and the second trench 21.

The second connection region 55b is in contact with the side surface of the second trench 21. The second connection region 55b is, for example, in contact with the bottom surface of the second trench 21. The second connection region 55b is, for example, in contact with the first surface F1.

The second connection region 55b between the second source region 53b and the second trench 21 is in contact with the second trench 21. The second connection region 55b between the second source region 53b and the second trench 21 is in contact with second gate insulating layer 23.

The second connection region 55b is in contact with the source electrode 41 on the first surface F1.

A plurality of the second connection regions 55b are repeatedly disposed in the first direction. The second connection regions 55b are repeatedly disposed at a second pitch (P2 in FIG. 2) in the first direction.

The length (L2 in FIG. 2) of the second connection region 55b in the first direction is, for example, equal to or greater than 0.5 μm and equal to or less than 3 μm.

The p$^+$-type third connection region 55c is in contact with the third electric field relaxation region 54c. The third connection region 55c is provided between the drift region 51 and the third trench 31. The third connection region 55c is provided between the third body region 52c and the third trench 31. The third connection region 55c is provided between the third source region 53c and the third trench 31.

The third connection region 55c is in contact with the side surface of the third trench 31. The third connection region 55c is, for example, in contact with the bottom surface of the third trench 31. The third connection region 55c is, for example, in contact with the first surface F1.

The third connection region 55c between the third source region 53c and the third trench 31 is in contact with the third trench 31. The third connection region 55c between the third source region 53c and the third trench 31 is in contact with third gate insulating layer 33.

The third connection region 55c is in contact with the source electrode 41 on the first surface F1.

A plurality of the third connection regions 55c are repeatedly disposed in the first direction. The third connection regions 55c are repeatedly disposed at the first pitch (P1 in FIG. 2) in the first direction.

The length of the third connection region 55c in the first direction is, for example, equal to or greater than 0.5 μm and equal to or less than 3 μm.

In the first cross section (FIG. 1) perpendicular to the first surface F1, perpendicular to the first direction, and including one of the first connection regions 55a, the second connection region 55b does not exist. In the first cross section (FIG. 1), a p$^+$-type connection region is not provided between the second trench 21 and the third trench 31.

In the second cross section (FIG. 3) parallel to the first cross section (FIG. 1), and including one of the second connection regions 55b, the first connection region 55a and the third connection region 55c do not exist. In the second cross section (FIG. 3), a p+-type connection region is not provided between the first trench 11 and the second trench 21.

In a third cross section (FIG. 4) parallel to the first cross section (FIG. 1) and second cross section (FIG. 3), and between the first cross section (FIG. 1) and the second cross section (FIG. 3), the first connection region 55a, the second connection region 55b, and the third connection region 55c do not exist. In the third cross section (FIG. 4), the p+-type connection region is not provided.

The first connection region 55a and the second connection region 55b are alternately disposed in the first direction. A first repetition pitch P1 is, for example, equal to a second repetition pitch P2.

The first connection region 55a and the second connection region 55b are, for example, alternately disposed at the same repetition pitch in the first direction. The repetition pitch of the first connection region 55a and second connection region 55b in the first direction is, for example, half the first repetition pitch P1. The repetition pitch of the first connection region 55a and second connection region 55b in the first direction is, for example, half the second repetition pitch P2.

The connection region 55 contains, for example, aluminum (Al) as a p-type impurity. The p-type impurity concentration of the connection region 55 is, for example, higher than the p-type impurity concentration of the body region 52. The p-type impurity concentration of the connection region 55 is, for example, higher than the n− type impurity concentration of the source region 53. The p-type impurity concentration of the connection region 55 is, for example, equal to or greater than $1\times10^{17}$ cm$^{-3}$ and equal to or less than $5\times10^{21}$ cm$^{-3}$.

The p-type impurity concentration of the first connection region 55a is, for example, higher than the n− type impurity concentration of the first source region 53a. The p-type impurity concentration of the second connection region 55b is, for example, higher than the n-type impurity concentration of the second source region 53b.

The connection region 55 can be formed, for example, by forming a trench in the silicon carbide layer 10 and then performing ion implantation of aluminum (Al) into the silicon carbide layer 10 from the side surface of the trench by using an oblique ion implantation method.

The connection region 55 can be formed, for example, by performing ion implantation of aluminum (Al) into the silicon carbide layer 10 under an ion implantation condition that the p-type impurity concentration higher than the n-type impurity concentration of the source region 53 formed on the entire surface of the first surface F1 is realized. The n-type impurity concentration of the source region 53 is compensated and the p-type impurity region to be the connection region 55 can be formed on the first surface F1.

The connection region 55 has a function of electrically connecting the electric field relaxation region 54 with the source electrode 41. The electric potential of the electric field relaxation region 54 is fixed at the electric potential of the source electrode 41 due to the connection region 55. The electric potential of the electric field relaxation region 54 is fixed at the source electric potential due to the connection region 55.

Next, a function and an effect of the semiconductor device according to the first embodiment will be described.

According to the MOSFET 100 of the first embodiment, it is possible to simultaneously realize the reduction of the on-resistance, the improvement of the reliability of the gate insulating layer, and the reduction of the switching loss. Details will be described below.

A trench gate structure in which a gate electrode is provided in a trench is applied to the MOSFET 100. By applying the trench gate structure, the channel area per unit area is increased, and the on-resistance of the MOSFET 100 is reduced. For example, when the MOSFET 100 is miniaturized by reducing the trench width and the repetition pitch of the trenches, the on-resistance of the MOSFET 100 is further reduced.

The MOSFET 100 has the electric field relaxation region 54 at the bottom portion of the trench. With the electric field relaxation region 54, an electric field applied to the gate insulating layer at the bottom portion of the trench is relaxed when the MOSFET 100 is turned off. Therefore, the reliability of the gate insulating layer is improved.

For example, when the electric potential of the electric field relaxation region 54 is in a floating state, the switching loss of the MOSFET increases. For example, when the electric potential of the electric field relaxation region 54 is in the floating state, it takes time to discharge holes from the electric field relaxation region 54 when the MOSFET is turned off. Therefore, the switching loss increases.

The MOSFET 100 has the connection region 55 electrically connecting the electric field relaxation region 54 with the body region 52. Since the MOSFET 100 has the connection region 55, the electric potential of the electric field relaxation region 54 is fixed at the electric potential of the source electrode 41. Therefore, for example, when the MOSFET is turned off, the discharge of holes from the electric field relaxation region 54 is promoted. Accordingly, the switching loss of the MOSFET 100 can be reduced.

In the MOSFET 100, the connection region 55 is provided to reach the first surface F1 along the side surface of the trench. The connection region 55 is in contact with the source electrode 41 on the first surface F1.

For example, the first connection region 55a reaches the first surface F1 along the side surface of the first trench 11. The first connection region 55a is in contact with the source electrode 41 on the first surface F1. Since the first connection region 55a is in contact with the first body region 52a, in the MOSFET 100, it is not necessary to newly provide a connection portion between the source electrode 41 and the first body region 52a. In other words, the connection portion between the source electrode 41 and the first connection region 55a also serves as a connection portion between the source electrode 41 and the first body region 52a.

Therefore, in the MOSFET 100, it is not necessary to separately provide the connection portion provided between the source electrode 41 and the first body region 52a between the first trench 11 and the second trench 21. Accordingly, the distance between the first trench 11 and the second trench 21 can be reduced.

Since the distance between the first trench 11 and the second trench 21 can be reduced, the on-resistance of the MOSFET 100 can be further reduced.

Since the distance between the first trench 11 and the second trench 21 is reduced, the width of the drift region 51 between the first connection region 55a and the second trench 21 is reduced. Therefore, saturation current when a short circuit occurs in the MOSFET 100 is suppressed. Accordingly, the short circuit tolerance of the MOSFET 100 is improved.

As illustrated in FIG. 2, in the MOSFET 100, the first connection region 55a and the second connection region 55b are alternately disposed in the first direction. Therefore, current paths of the MOSFET 100 are alternately formed in the first direction. Therefore, the heat generating portions are dispersed without being biased in the MOSFET 100. Accordingly, the malfunction of the MOSFET 100 due to heat generation is suppressed, and the reliability of the MOSFET 100 is improved.

The inclination angle of the side surface of the trench with respect to the m-face is preferably equal to or greater than zero degrees and equal to or less than five degrees. In a case where the inclination direction of the first surface F1 is the <11-20> direction, that is, the a-axis direction, when the side surface of the trench is set to be a surface close to the m-face, it is easy to align the plane orientations of two opposed side surfaces of one trench to the close plane orientations. Therefore, it is easy to make threshold voltages and mobilities of the transistors respectively formed on both the side surfaces of the trench equal to each other.

On the other hand, in a case where the inclination direction of the first surface F1 is the <11-20> direction, that is, the a-axis direction, when the side surface of the trench is set to be a surface close to the a-face, it is difficult to align the plane orientations of two opposed side surfaces of one trench to the close plane orientations. Therefore, it is difficult to make threshold voltages and mobilities of the transistors respectively formed on both the side surfaces of the trench equal to each other.

Modification Example

Figure 6:
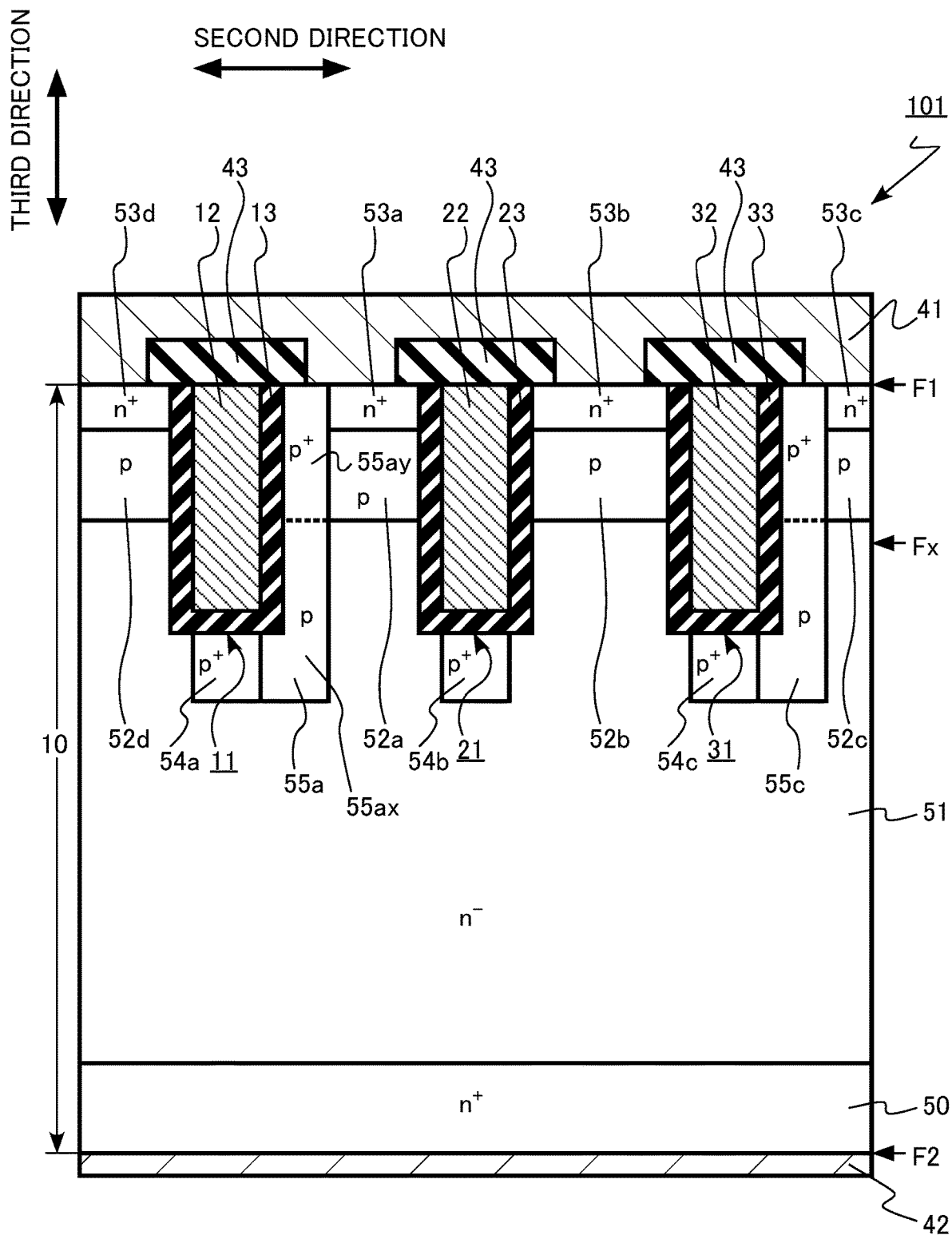
FIG. 6 is a schematic cross-sectional view of a semiconductor device according to a modification example of the first embodiment.

FIG. 6 is a schematic cross-sectional view of a semiconductor device according to the modification example of the first embodiment. FIG. 6 is a view corresponding to FIG. 1 of the first embodiment.

A MOSFET 101 of the modification example is different from the MOSFET 100 of the first embodiment in that the first connection region 55a includes a first region 55ax between the drift region 51 and the first trench 11 and a second region 55ay between the first source region 53a and the first trench 11.

The p-type impurity concentration of the first region 55ax is lower than the p-type impurity concentration of the second region 55ay. The p-type impurity concentration of the first region 55ax is equal to or less than one-tenth of the p-type impurity concentration of the second region 55ay.

For example, when the first connection region 55a is formed by an oblique ion implantation method performed from a first side surface after the first trench 11 is formed, the second region 55ay can be formed by performing additional ion implantation only on the upper portion of the first trench 11.

In the MOSFET 101 of the modification example, the p-type impurity concentration of a portion of the connection region 55 in contact with the drift region 51 is made low. Therefore, the electric field at the bottom portion of the connection region 55 is relaxed, and breakdown of a pn junction is suppressed. Accordingly, the withstand voltage of the MOSFET 101 is improved.

As described above, in the MOSFET of the first embodiment and the modification example, it is possible to simultaneously realize the reduction of the on-resistance, the improvement of the reliability of the gate insulating layer, and the reduction of the switching loss.

Second Embodiment

A semiconductor device according to the second embodiment is different from the semiconductor device according to the first embodiment in that the ninth silicon carbide region exists in the first cross section perpendicular to the first surface, perpendicular to the first direction, and including one of the eighth silicon carbide regions. Hereinafter, description of the contents overlapping with the first embodiment may be partially omitted.

Figure 7:
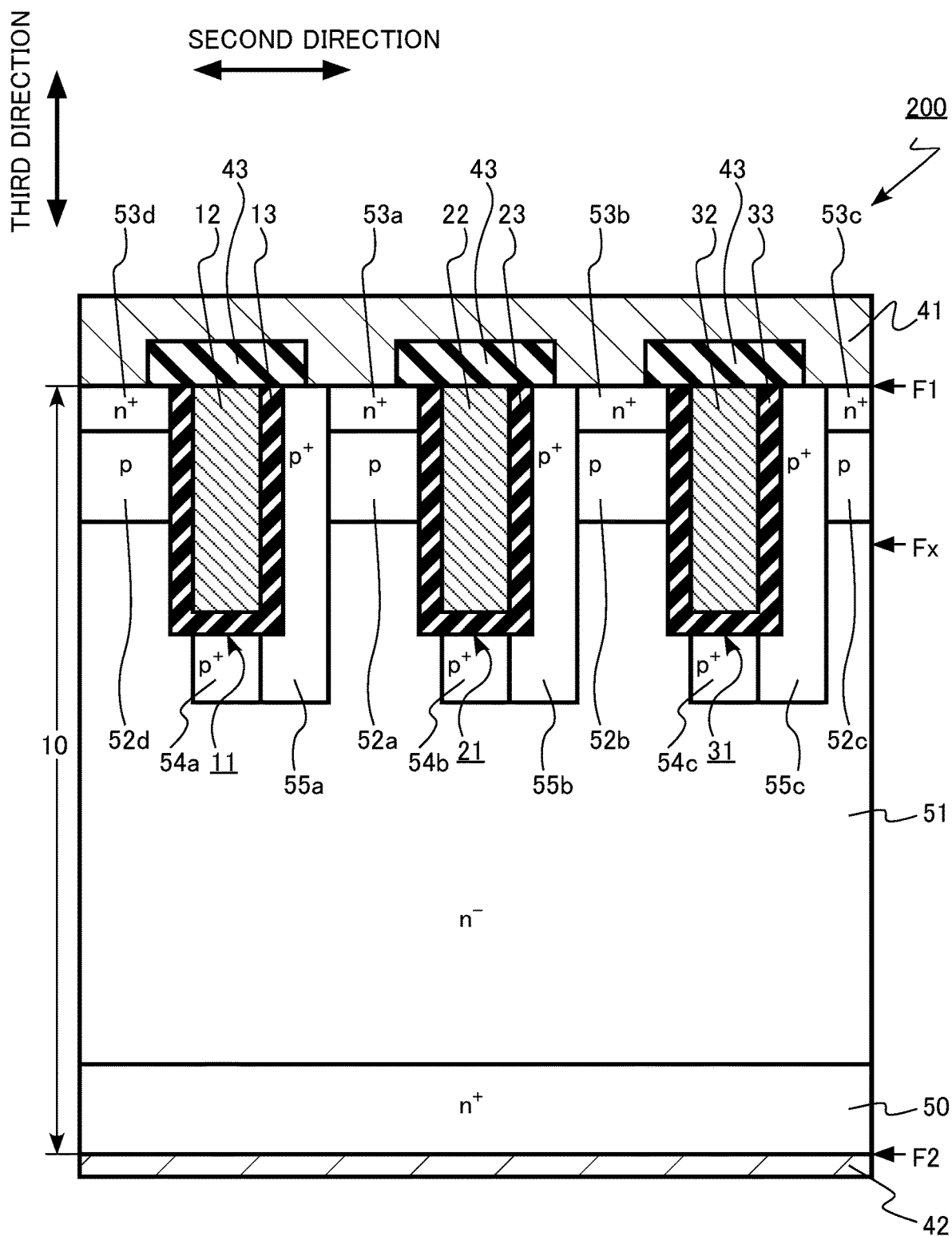
FIG. 7 is a schematic cross-sectional view of a semiconductor device according to a second embodiment.

FIG. 7 is a schematic cross-sectional view of the semiconductor device according to the second embodiment. The semiconductor device of the second embodiment is a trench gate type vertical MOSFET 200 using silicon carbide. The MOSFET 200 is an n-channel type MOSFET using electrons as carriers.

Figure 8:
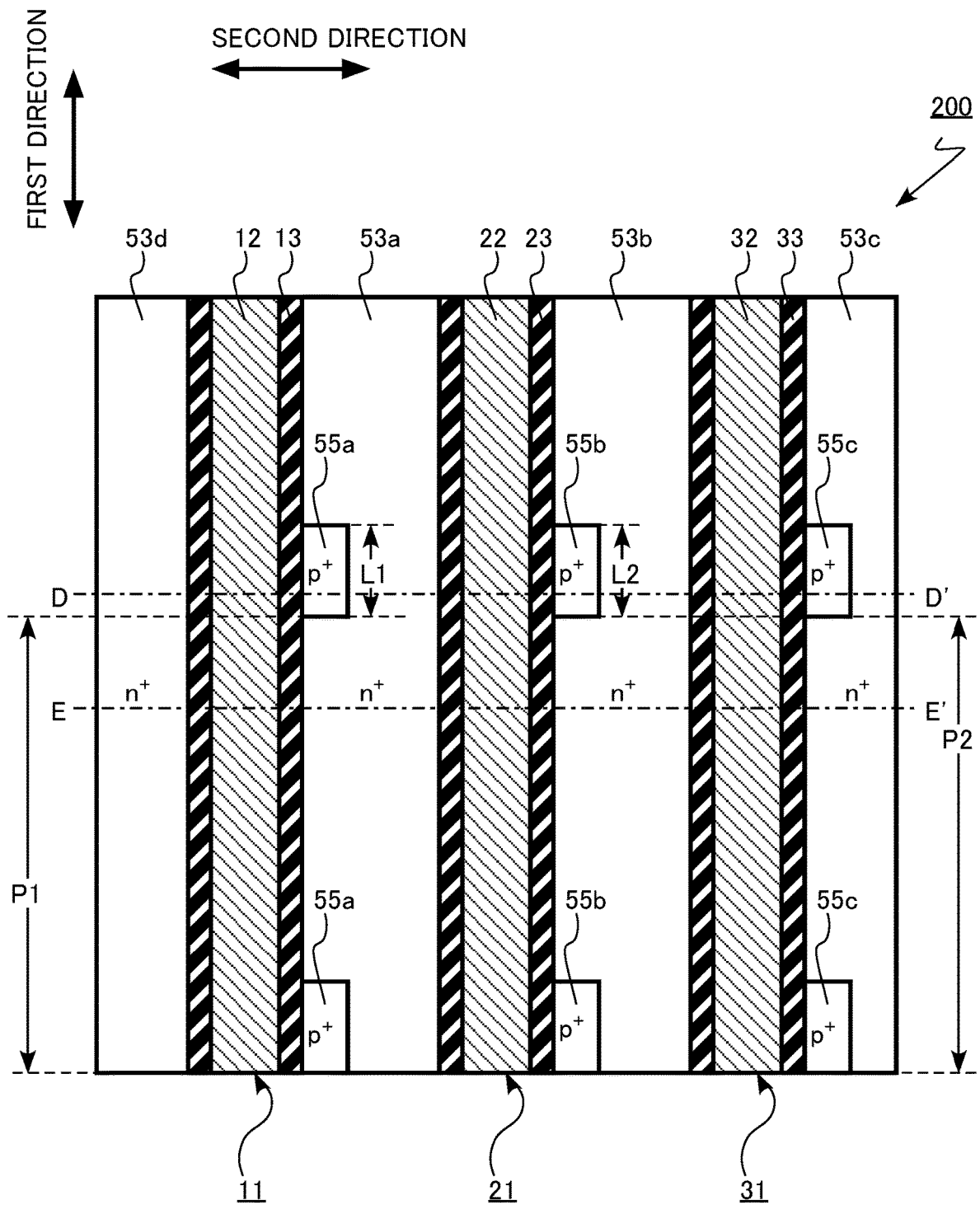
FIG. 8 is a schematic plan view of the semiconductor device according to the second embodiment.

FIG. 8 is a schematic plan view of the semiconductor device according to the second embodiment. FIG. 8 is a plan view of the first surface (F1 in FIG. 7) of FIG. 7. The first direction and the second direction are directions parallel to the first surface F1. The second direction is a direction perpendicular to the first direction. FIG. 7 is a cross-sectional view taken along line D-D' of FIG. 8. D-D' cross section is an example of the first cross section.

Figure 9:
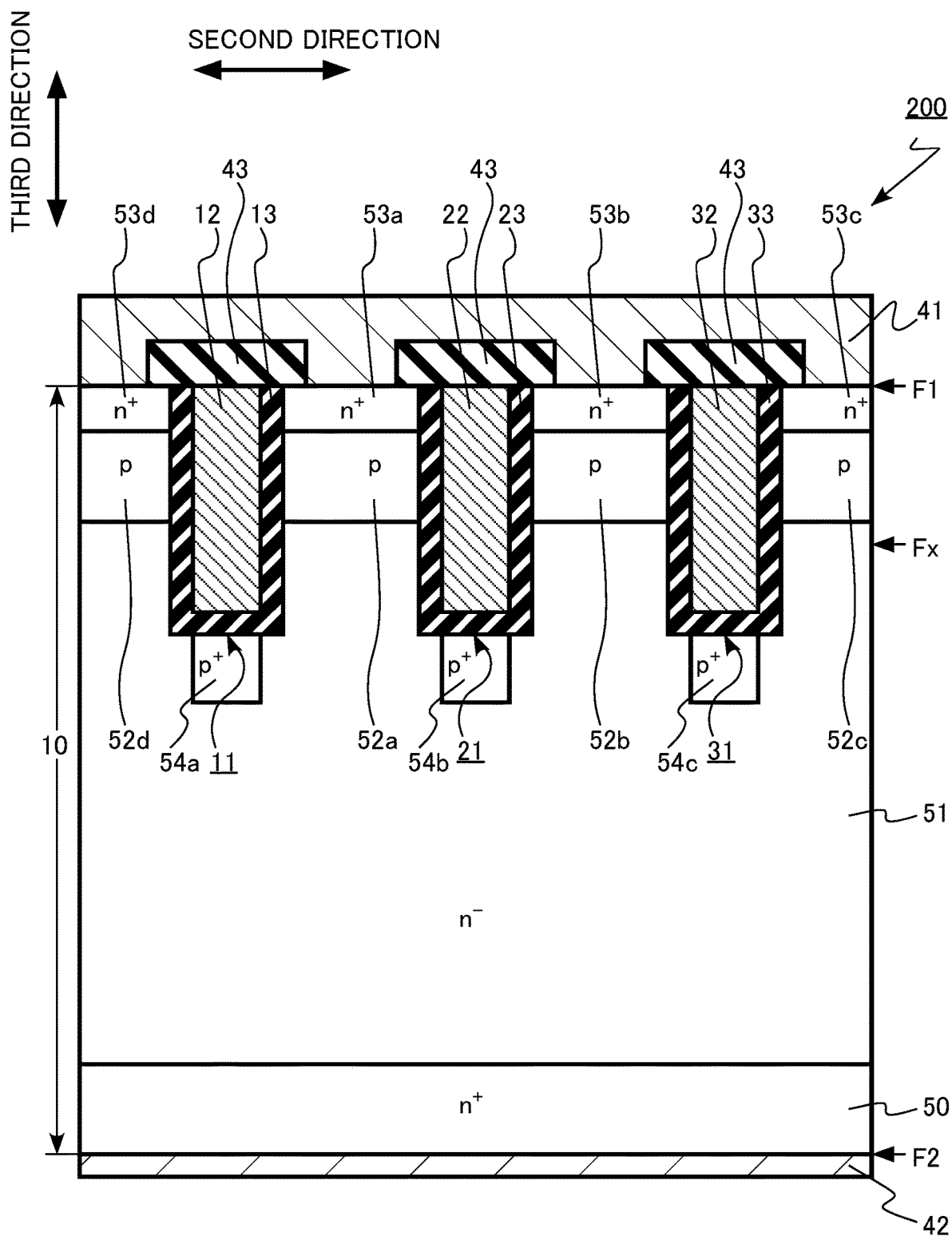
FIG. 9 is a schematic cross-sectional view of the semiconductor device according to the second embodiment.

FIG. 9 is a schematic cross-sectional view of the semiconductor device according to the second embodiment. FIG. 9 is a cross-sectional view taken along line E-E' of FIG. 8.

The MOSFET 200 includes a silicon carbide layer 10, a first trench 11, a first gate electrode 12, a first gate insulating layer 13, a second trench 21, a second gate electrode 22, a second gate insulating layer 23, a third trench 31, a third gate electrode 32, a third gate insulating layer 33, a source electrode 41 (first electrode), a drain electrode 42 (second electrode), and an interlayer insulating layer 43.

Hereinafter, the first trench 11, the second trench 21, and the third trench 31 may be collectively referred to as a trench. The first gate electrode 12, the second gate electrode 22, and the third gate electrode 32 may be collectively referred to as a gate electrode. The first gate insulating layer 13, the second gate insulating layer 23, and the third gate insulating layer 33 may be collectively referred to as a gate insulating layer.

In the silicon carbide layer 10, an $n^+$-type drain region 50, an $n^-$-type drift region 51 (first silicon carbide region), a p-type first body region 52a (second silicon carbide region), a p-type second body region 52b (third silicon carbide region), a p-type third body region 52c, a p-type fourth body region 52d, an $n^+$-type first source region 53a (fourth silicon carbide region), an $n^+$-type second source region 53b (fifth silicon carbide region), an $n^+$-type third source region 53c, an $n^+$-type fourth source region 53d, a $p^+$-type first electric field relaxation region 54a (sixth silicon carbide region), a $p^+$-type second electric field relaxation region 54b (seventh silicon carbide region), a $p^+$-type third electric field relaxation region 54c, a $p^+$-type first connection region 55a (eighth silicon carbide region), a $p^+$-type second connection region 55b (ninth silicon carbide region), and a $p^+$-type third connection region 55c are provided.

Hereinafter, the first body region 52a, the second body region 52b, the p-type third body region 52c, and the fourth body region 52d may be collectively referred to as a body region 52. The first source region 53a, the second source region 53b, the third source region 53c, and the fourth source region 53d may be collectively referred to as a source region 53. The first electric field relaxation region 54a, the second electric field relaxation region 54b, and the third electric field relaxation region 54c may be collectively referred to as an electric field relaxation region 54. The first connection region 55a, the second connection region 55b, and the third connection region 55c may be collectively referred to as a connection region 55.

As illustrated in FIG. 8, a plurality of the first connection regions 55a are repeatedly disposed in the first direction. The first connection regions 55a are repeatedly disposed at a first pitch (P1 in FIG. 8) in the first direction.

The length (L1 in FIG. 8) of the first connection region 55a in the first direction is, for example, equal to or greater than 0.5 μm and equal to or less than 3 μm.

A plurality of the second connection regions 55b are repeatedly disposed in the first direction. The second connection regions 55b are repeatedly disposed at a second pitch (P2 in FIG. 8) in the first direction.

The length (L2 in FIG. 8) of the second connection region 55b in the first direction is, for example, equal to or greater than 0.5 μm and equal to or less than 3 μm.

A plurality of the third connection regions 55c are repeatedly disposed in the first direction. The third connection regions 55c are repeatedly disposed at the first pitch (P1 in FIG. 8) in the first direction.

In a first cross section (FIG. 7) perpendicular to the first surface F1, perpendicular to the first direction, and including one of the first connection regions 55a, the second connection region 55b exists. In the first cross section (FIG. 7), a p$^+$-type connection region exists between the first trench 11 and the second trench 21 and between the second trench 21 and the third trench 31.

In a second cross section (FIG. 9) parallel to the first cross section (FIG. 7) and spaced from the first cross section (FIG. 7) in the first direction, the first connection region 55a, the second connection region 55b, and the third connection region 55c do not exist. In the second cross section (FIG. 9), the p$^+$-type connection region is not provided between the first trench 11 and the second trench 21 and between the second trench 21 and the third trench 31.

The first connection region 55a and the second connection region 55b are disposed in parallel in the first direction. The second connection region 55b is disposed in the second direction of the first connection region 55a. The first repetition pitch P1 is equal to the second repetition pitch P2.

In the MOSFET 200 of the second embodiment, it is possible to simultaneously realize the reduction of the on-resistance, the improvement of the reliability of the gate insulating layer, and the reduction of the switching loss due to the same function as that of the MOSFET 100 of the first embodiment.

Modification Example

Figure 10:
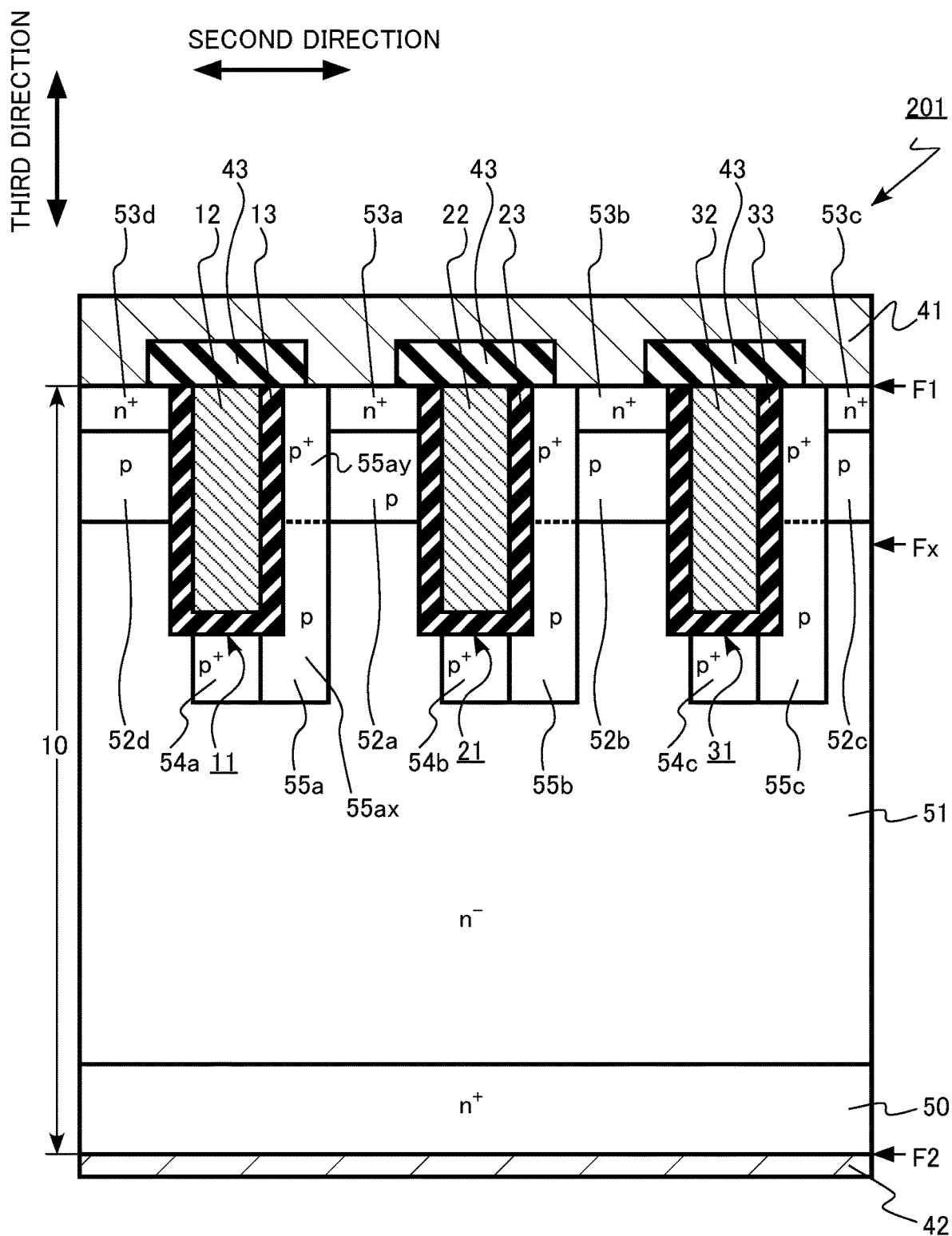
FIG. 10 is a schematic cross-sectional view of a semiconductor device according to a modification example of the second embodiment.

FIG. 10 is a schematic cross-sectional view of a semiconductor device according to the modification example of the second embodiment. FIG. 10 is a view corresponding to FIG. 7 of the second embodiment.

A MOSFET 201 of the modification example is different from the MOSFET 200 of the second embodiment in that the first connection region 55a includes a first region 55ax between the drift region 51 and the first trench 11 and a second region 55ay between the first source region 53a and the first trench 11.

The p-type impurity concentration of the first region 55ax is lower than the p-type impurity concentration of the second region 55ay. The p-type impurity concentration of the first region 55ax is equal to or less than one-tenth of the p-type impurity concentration of the second region 55ay.

For example, when the first connection region 55a is formed by an oblique ion implantation method performed from a first side surface after the first trench is formed, the second region 55ay can be formed by performing additional ion implantation only on the upper portion of the first trench.

In the MOSFET 201 of the modification example, the p-type impurity concentration of a portion of the connection region 55 in contact with the drift region 51 is made low. Therefore, the electric field at the bottom portion of the connection region 55 is relaxed, and breakdown of a pn junction is suppressed. Accordingly, the withstand voltage of the MOSFET 201 is improved.

As described above, in the MOSFET of the second embodiment and the modification example, it is possible to simultaneously realize the reduction of the on-resistance, the improvement of the reliability of the gate insulating layer, and the reduction of the switching loss.

Third Embodiment

An inverter circuit and a driving device of the third embodiment are driving devices including the semiconductor device of the first embodiment.

Figure 11:
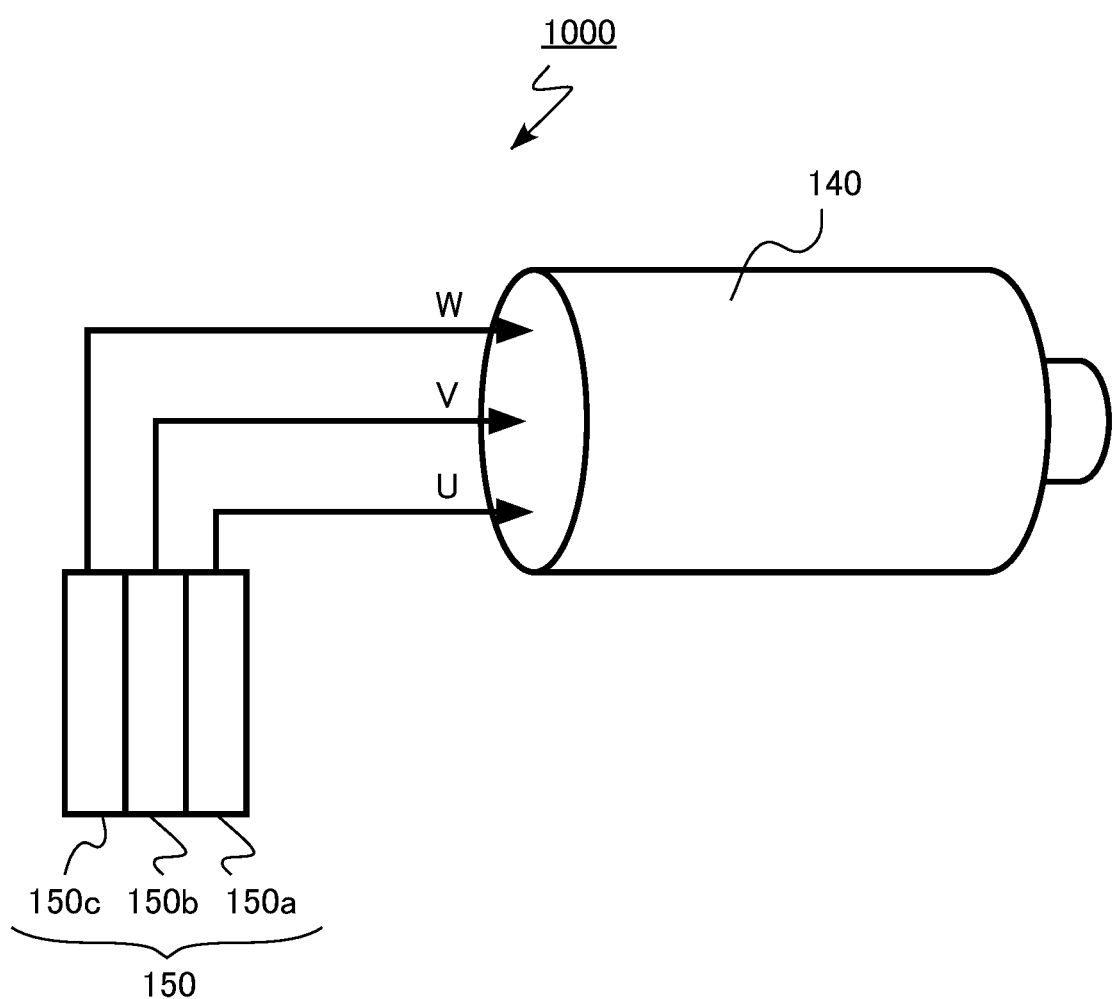
FIG. 11 is a schematic view of a driving device according to a third embodiment.

FIG. 11 is a schematic view of the driving device according to the third embodiment. A driving device 1000 includes a motor 140 and an inverter circuit 150.

The inverter circuit 150 includes three semiconductor modules 150a, 150b, and 150c using the MOSFET 100 of the first embodiment as a switching element. By connecting three semiconductor modules 150a, 150b, and 150c in parallel, a three-phase inverter circuit 150 including three AC voltage output terminals U, V, and W is realized. The motor 140 is driven by an AC voltage output from the inverter circuit 150.

According to the third embodiment, the property of the inverter circuit 150 and the property of the driving device 1000 are improved by including the MOSFET 100 with improved property.

Fourth Embodiment

A vehicle according to the fourth embodiment is a vehicle including the semiconductor device according to the first embodiment.

Figure 12:
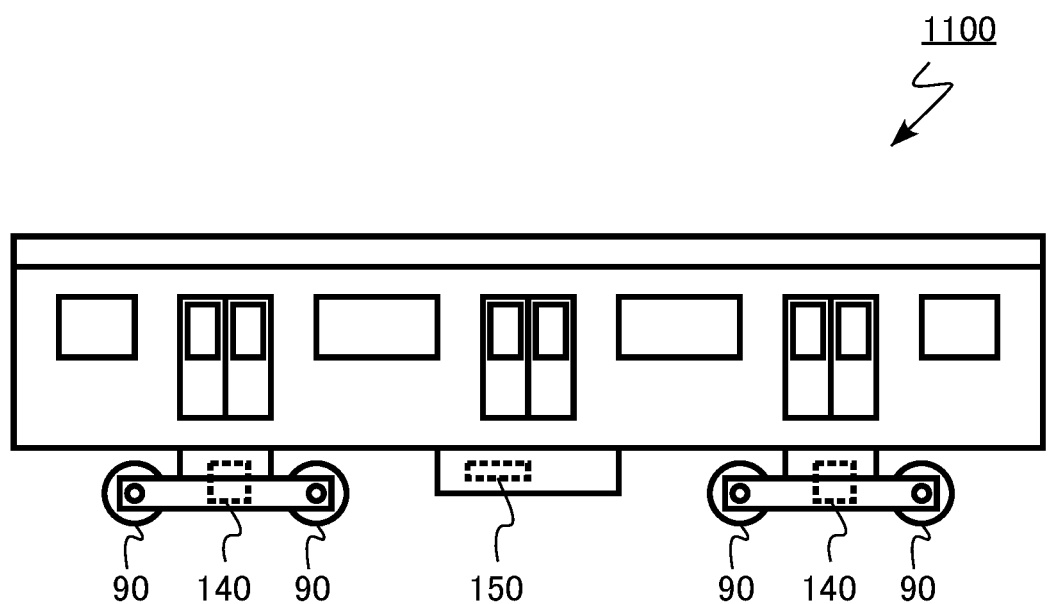
FIG. 12 is a schematic view of a vehicle according to a fourth embodiment.

FIG. 12 is a schematic view of the vehicle according to the fourth embodiment. A vehicle 1100 of the fourth embodiment is a railway vehicle. The vehicle 1100 includes a motor 140 and an inverter circuit 150.

The inverter circuit 150 includes three semiconductor modules using the MOSFET 100 of the first embodiment as a switching element. By connecting three semiconductor modules in parallel, a three-phase inverter circuit 150 including three AC voltage output terminals U, V, and W is realized. The motor 140 is driven by an AC voltage output from the inverter circuit 150. Wheels 90 of the vehicle 1100 are rotated by the motor 140.

According to the fourth embodiment, the property of the vehicle 1100 is improved by including the MOSFET 100 with improved property.

Fifth Embodiment

A vehicle according to the fifth embodiment is a vehicle including the semiconductor device according to the first embodiment.

Figure 13:
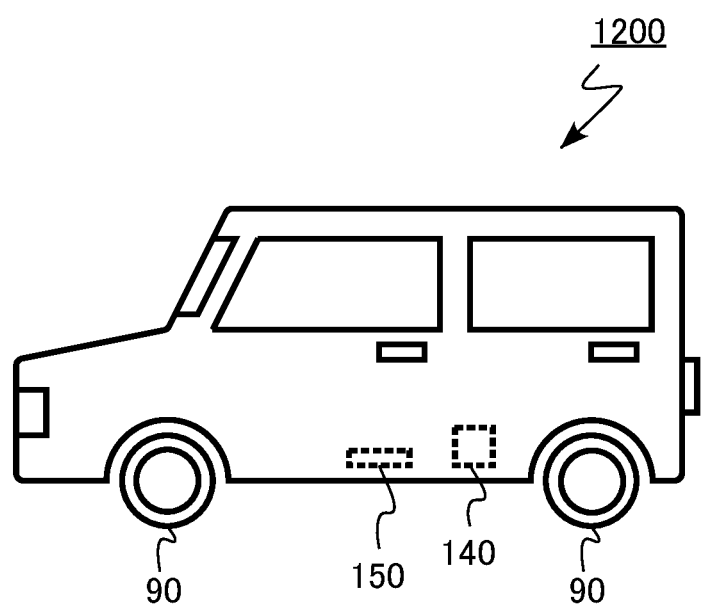
FIG. 13 is a schematic view of a vehicle according to a fifth embodiment.

FIG. 13 is a schematic view of the vehicle according to the fifth embodiment. A vehicle 1200 of the fifth embodiment is an automobile. The vehicle 1200 includes a motor 140 and an inverter circuit 150.

The inverter circuit 150 includes three semiconductor modules using the MOSFET 100 of the first embodiment as a switching element. By connecting three semiconductor modules in parallel, a three-phase inverter circuit 150 including three AC voltage output terminals U, V, and W is realized.

The motor 140 is driven by an AC voltage output from the inverter circuit 150. Wheels 90 of the vehicle 1200 are rotated by the motor 140.

According to the fifth embodiment, the property of the vehicle 1200 is improved by including the MOSFET 100 with improved property.

Sixth Embodiment

An elevator according to the sixth embodiment is an elevator including the semiconductor device according to the first embodiment.

Figure 14:
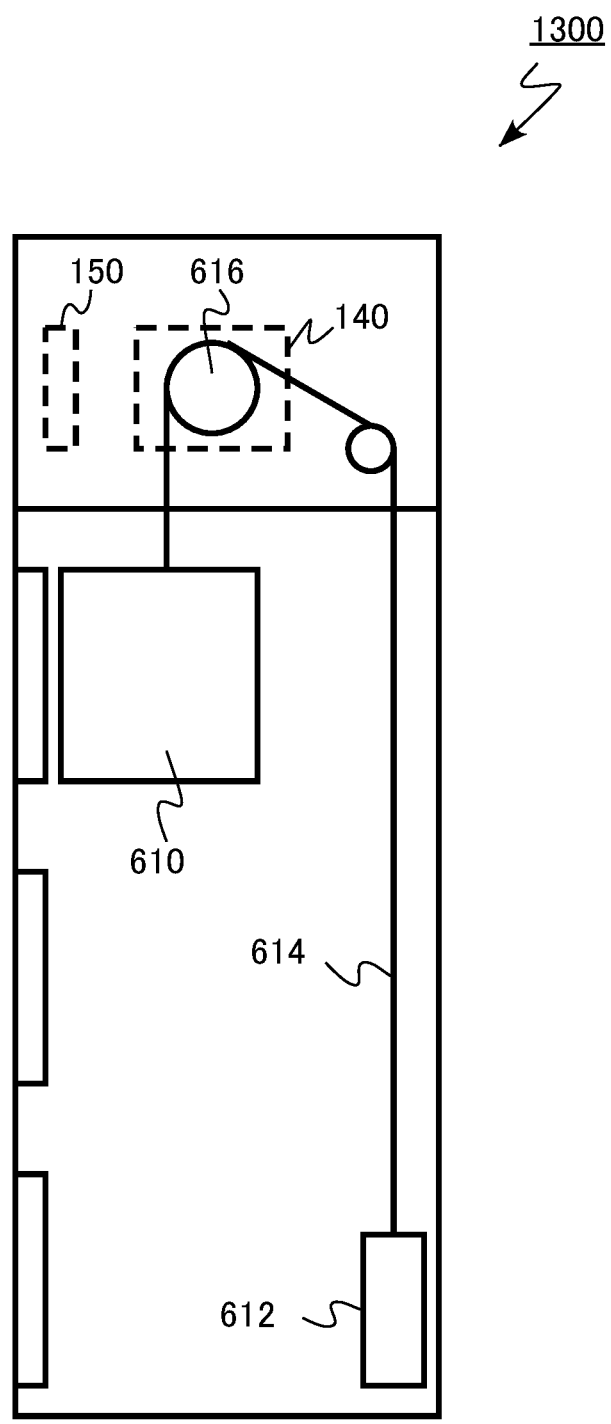
FIG. 14 is a schematic view of an elevator according to a sixth embodiment.

FIG. 14 is a schematic view of the elevator according to the sixth embodiment. An elevator 1300 of the sixth embodiment includes a car 610, a counterweight 612, a wire rope 614, a hoisting machine 616, a motor 140, and an inverter circuit 150.

The inverter circuit 150 includes three semiconductor modules using the MOSFET 100 of the first embodiment as a switching element. By connecting three semiconductor modules in parallel, a three-phase inverter circuit 150 including three AC voltage output terminals U, V, and W is realized.

The motor 140 is driven by an AC voltage output from the inverter circuit 150. The hoisting machine 616 is rotated by the motor 140, and the car 610 moves up and down.

According to the sixth embodiment, the property of the elevator 1300 is improved by including the MOSFET 100 with improved property.

As described above, in the first and second embodiments, the case of 4H-SiC has been described as an example of the crystal structure of silicon carbide, but the present disclosure can also be applied to silicon carbide having other crystal structures such as 6H-SiC and 3C-SiC.

In the first and second embodiments, the MOSFET has been described as an example of the semiconductor device, but the present disclosure can also be applied to an insulated gate bipolar transistor (IGBT). For example, the IGBT can be realized by changing the type of a region corresponding to the drain region 50 of the MOSFET 100 from n-type to p-type.

In the third to sixth embodiments, the case of including the semiconductor device of the first embodiment has been described as an example, but the semiconductor device of the second embodiment can also be applied.

In the third to sixth embodiments, the case where the semiconductor device of the present disclosure is applied to a vehicle or an elevator has been described as an example. However, the semiconductor device of the present disclosure can also be applied to, for example, a power conditioner of a solar power generation system.

While certain embodiments have been described, these embodiments have been presented by way of example only, and are not intended to limit the scope of the inventions. Indeed, the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
a silicon carbide layer having a first surface parallel to a first direction and a second direction perpendicular to the first direction, and a second surface parallel to the first surface;
a first trench existing in the silicon carbide layer and extending in the first direction on the first surface;
a first gate electrode located in the first trench;
a first gate insulating layer located between the first gate electrode and the silicon carbide layer;
a second trench existing in the silicon carbide layer and extending in the first direction on the first surface;
a second gate electrode located in the second trench;
a second gate insulating layer located between the second gate electrode and the silicon carbide layer;
a third trench existing in the silicon carbide layer, extending in the first direction on the first surface, and the second trench located between the third trench and the first trench;
a third gate electrode located in the third trench;
a third gate insulating layer located between the third gate electrode and the silicon carbide layer;
an n-type first silicon carbide region located in the silicon carbide layer;
a p-type second silicon carbide region located in the silicon carbide layer, between the first silicon carbide region and the first surface, and between the first trench and the second trench;
a p-type third silicon carbide region located in the silicon carbide layer, between the first silicon carbide region and the first surface, and between the second trench and the third trench;
an n-type fourth silicon carbide region located in the silicon carbide layer and between the second silicon carbide region and the first surface;
an n-type fifth silicon carbide region located in the silicon carbide layer and between the third silicon carbide region and the first surface;
a p-type sixth silicon carbide region located in the silicon carbide layer and between the first silicon carbide region and the first trench;
a p-type seventh silicon carbide region located in the silicon carbide layer and between the first silicon carbide region and the second trench;
a plurality of p-type eighth silicon carbide regions located in the silicon carbide layer, in contact with the sixth silicon carbide region, and located between the first silicon carbide region and the first trench, between the second silicon carbide region and the first trench in the second direction, and between the fourth silicon carbide region and the first trench in the second direction, the p-type eighth silicon carbide regions being repeatedly disposed in the first direction;
a plurality of p-type ninth silicon carbide regions located in the silicon carbide layer, in contact with the seventh silicon carbide region, and located between the first silicon carbide region and the second trench, between the third silicon carbide region and the second trench, and between the fifth silicon carbide region and the second trench, the p-type ninth silicon carbide regions being repeatedly disposed in the first direction;
a first electrode located on the first surface side with respect to the silicon carbide layer and in contact with the fourth silicon carbide region, the fifth silicon carbide region, the eighth silicon carbide region, and the ninth silicon carbide region; and a second electrode located on the second surface side with respect to the silicon carbide layer, wherein in a first cross section perpendicular to the first surface, perpendicular to the first direction, and including one of the eighth silicon carbide regions, the one of the eighth silicon carbide regions is provided to reach the first surface sequentially along a side surface of the first trench, the one of the eighth silicon carbide regions is in direct contact with the first trench sequentially from an interface between the one of the eighth silicon carbide regions and the sixth silicon carbide region to the first surface, and the one of the eighth silicon carbide regions is in direct contact with the first electrode on the first surface.

2. The semiconductor device according to claim 1, wherein in the first cross section, the ninth silicon carbide region does not exist, and in a second cross section parallel to the first cross section and including one of the ninth silicon carbide regions, the eighth silicon carbide region does not exist.

3. The semiconductor device according to claim 2, wherein in a third cross section parallel to the first cross section and the second cross section, and located between the first cross section and the second cross section, the eighth silicon carbide region and the ninth silicon carbide region do not exist.

4. The semiconductor device according to claim 1, wherein in the first cross section, the ninth silicon carbide region exists.

5. The semiconductor device according to claim 1, wherein the eighth silicon carbide region between the fourth silicon carbide region and the first trench in the second direction is in contact with the first trench.

6. The semiconductor device according to claim 1, wherein a p-type impurity concentration of the eighth silicon carbide region is higher than an n-type impurity concentration of the fourth silicon carbide region.

7. The semiconductor device according to claim 1, wherein the eighth silicon carbide region includes a first region between the first silicon carbide region and the first trench in the second direction, and a second region between the fourth silicon carbide region and the first trench in the second direction, the fourth silicon carbide region is in direct contact with the first electrode on the first surface, and a p-type impurity concentration of the first region is lower than a p-type impurity concentration of the second region.

8. The semiconductor device according to claim 7, wherein a p-type impurity concentration of the eighth silicon carbide region is higher than a p-type impurity concentration of the second silicon carbide region.

9. The semiconductor device according to claim 7, wherein a p-type impurity concentration of the eighth silicon carbide region is equal to or greater than $1\times 10^{17}$ cm$^{-3}$ and equal to or less than $5\times 10^{21}$ cm$^{-3}$, and a p-type impurity concentration of higher than a p-type impurity concentration of the second silicon carbide region is equal to or greater than $5\times 10^{16}$ cm$^{-3}$ and equal to or less than $5\times 10^{17}$ cm$^{-3}$.

10. The semiconductor device according to claim 1, wherein the first surface is a surface inclined at equal to or greater than zero degrees and equal to or less than eight degrees in an a-axis direction with respect to a (0001) face, and the first direction is in a same plane as the a-axis direction.

11. The semiconductor device according to claim 1, wherein an inclination angle of a side surface of the first trench with respect to an m-face is equal to or greater than zero degrees and equal to or less than five degrees.

12. An inverter circuit comprising the semiconductor device according to claim 1.

13. A driving device comprising the semiconductor device according to claim 1.

14. A vehicle comprising the semiconductor device according to claim 1.

15. An elevator comprising the semiconductor device according to claim 1.

* * * * *